457-47 SR
11/4/86 DR 000,147

United States Statutory Invention Registration [19]

[11] Reg. Number: H147
[43] Published: Nov. 4, 1986

Feldman et al.

[54] HIGH RESISTIVITY GROUP III-V COMPOUNDS BY HELIUM BOMBARDMENT

[75] Inventors: Leonard C. Feldman, Berkeley Heights; Marlin W. Focht, Stewartsville; Albert T. Macrander, Summit; Bertram Schwartz, Westfield, all of N.J.

[73] Assignee: AT&T Bell Laboratories, Murray Hill, N.J.

[21] Appl. No.: 499,775

[22] Filed: May 31, 1983

[51] Int. Cl.[4] ..... H01L 27/02; H01L 21/00
[52] U.S. Cl. ..... 357/47; 357/91; 357/17; 372/46; 29/576 B
[58] Field of Search ..... 357/47, 91, 17, 61, 357/63, 64; 372/46

[56] References Cited

U.S. PATENT DOCUMENTS 3,912,556 10/1975 Grenon et al. ..... 357/17
4,355,396 10/1982 Hawrylo et a l. ..... 372/46
4,447,905 5/1984 Dixon et al. ..... 357/17

FOREIGN PATENT DOCUMENTS 2421961 11/1975 Fed. Rep. of Germany ..... 372/46

*Primary Examiner*—S. C. Buczinski
*Assistant Examiner*—Linda J. Wallace
*Attorney, Agent, or Firm*—Michael J. Urbano

[57] ABSTRACT

Helium-3 and helium-4 bombardment of InP over a fluence range of $10^{11}$ to $10^{16}$ ions/cm$^2$ reproducibly forms highly resistive regions in both p-type and n-type single crystal material. Average peak resistivities are about $10^9$ ohm-cm for p-type InP and are about $10^3$ ohm-cm for n-type InP. High resistivity has also been produced in GaP, GaSb, GaAs, and InGaAs by helium bombardment. Stripe geometry lasers and planar photodiodes which incorporate helium-bombarded zones are described.

19 Claims, 5 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH RESISTIVITY GROUP III-V COMPOUNDS BY HELIUM BOMBARDMENT

BACKGROUND OF THE INVENTION

This invention relates to semiconductor devices and, more particularly, to the fabrication of high resistivity zones in such devices by ion bombardment.

Ion bombardment has been utilized to produce highly resistive, typically semi-insulating, zones of semiconductor material in an otherwise low resistivity semiconductor body. These zones serve a variety of functions: device isolation, p-n junction passivation and current confinement.

In the GaAs/AlGaAs materials system a number of ionic species, including hydrogen, oxygen and neon ions, have been used to bombard the material and create high resistivity. However, hydrogen ions (protons) are by far the most commonly used in the fabrication of practical devices; for example, semiconductor laser, LEDs, photodetectors, and FETs. Within this spectrum of devices the dominant application of proton bombardment has been in the fabrication of strip geometry, gain-guided heterostructure lasers. In these lasers laterally separate, high resistivity, proton-bombarded zones constrain pumping current to flow primarily in a narrow (e.g., 5 μm wide), unbombarded, low resistivity channel between the zones. For this purpose, the bombardment damage that results from the impingement of medium energy protons (i.e., 50–300 keV) on the unprotected areas yields semi-insulating material ($>10^9$ ohm-cm) to a depth of 2–3 μm, J. C. Dyment et al, *Journal of Applied Physics,* vol. 44, p. 207 (1973).

Because of the widespread interest in similar devices fabricated in the InP/InGaAsP and InP/InGaAs materials systems, it would be desirable to have a technique to form semi-insulating zones in these materials. Although J. P. Donnelly et al, *Solid State Electronics,* vol. 20, p. 727 (1977), have shown that proton bombardment can be used to make highly resistive regions in p-type InP, this specific technique is not readily reproducible. The correct fluence is very critical and at high fluence, type conversion occurs, J. P. Donnelly et al, *Nuclear Instruments and Methods,* vol. 182/183, p. 553 (1981).

Recently bombardment of p-type InP with deuterons was reported to produce highly resistive regions ($>10^9$ ohm-cm), M. W. Focht et al, *Applied Physics Letters,* vol. 42, No. 11, p. 970 (1983). This technique was successfully used to make gain-guided InP lasers and to improve the device characteristics of a buried channel InP structure. Although this approach appears to bye very controllable and reproducible, there is a troublesome side effect during the bombardment procedure; namely, a deuteron-deuteron reaction that results in neutrons which are a safety hazard.

SUMMARY OF THE INVENTION

In accordance with one aspect of our invention, high resistivity is created in Group III-V compound semiconductors by bombardment with helium ions, either $^4$He (helium-4) or $^3$He (helium-3) ions. Suitable masking enables high resistivity zones to be formed for device applications. Thus, in another aspect, our invention is a stripe geometry laser in which the current-constraining regions are helium-bombarded zones, or it is a photodiode in which helium-bombarded zones surround the active region and penetrate the p-n junction to provide passivation.

This type of bombardment has the advantages of reproducibility as well as the absence of type conversion and hazardous neutron side effects; hence, it is well suited to the fabrication of InP/InGaAsP devices.

BRIEF DESCRIPTION OF THE DRAWING

Our invention, together with its various features and advantages, can be readily understood from the following, more detailed description taken in conjunction with the accompanying drawings, in which

FIG. 1 is a schematic showing how a typical Group III-V compound sample is masked and helium bombarded in accordance with one aspect of our invention;

Figure 4:
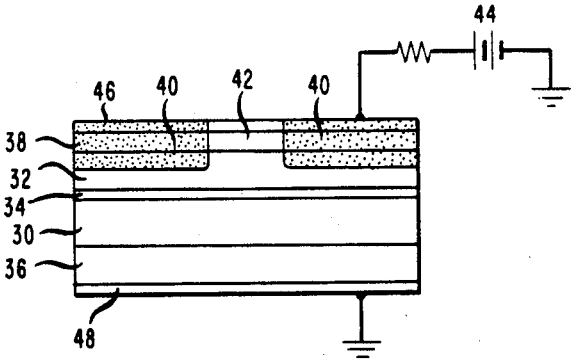
Figure 5:
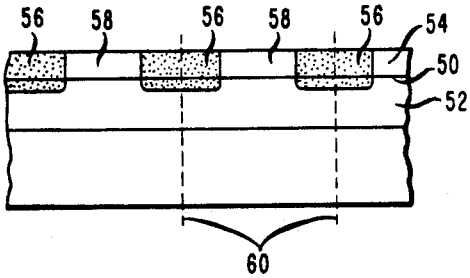

Curve I: helium-3, n-InP at $1\times10^{18}$ cm$^{-3}$
Curve II: helium-4, n-InP at $1\times10^{18}$ cm$^{-3}$
Curve III: helium-3, p-InP at $9\times10^{17}$ cm$^{-3}$
Curve IV: helium-3, p-InP at $6\times10^{18}$ cm$^{-3}$
Curve V: helium-4, p-InP at $6\times10^{18}$ cm$^{-3}$;

FIG. 4 is a schematic of a stripe geometry heterostructure laser in accordance with another aspect of our invention; and FIg. 5 is a schematic of a photodiode or LED structure in accordance with yet another aspect of our invention.

DETAILED DESCRIPTION

Figure 1:
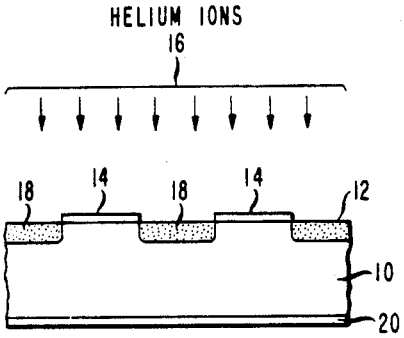
FIG. 1, 4 and 5 are not drawn to scale in the interest of simplicity.

With reference now to FIG. 1, there is shown a Group III-V compound single crystal semiconductor body 10 which may include one or more epitaxial layers of Group III-V compounds, typically those which can be readily lattice-matched to one another; e.g., InP, InGaAsP and InGaAs; or GaAs and AlGaAs. On the surface 12 of body 10 to be bombarded, suitable masks 14 are formed by techniques well-known in the art (e.g., photolithography). The composition and thickness of the masks are chosen to block the penetration of ions into masked portions of body 10. In accordance with our invention, the ion beam 16 comprises either helium-3 ions or helium-4 ions. When these ions impinge upon the unmasked portions of surface 12, they penetrate into body 10 to a depth which depends upon the ion energy. The ions damage the bady 10 and produce high resistivity zones 18.

Briefly, in the fluence range of $10^{11}$–$10^{16}$ ions/cm$^2$, highly resistive regions in both p-InP and n-InP are reproducibly formed. Peak resistivities are about $10^9$ ohm-cm for p-InP and are about $10^3$ ohm-cm for n-InP. For ion energies of about 150–300 keV penetration depths of about 0.9–1.7 μm were realized.

High resistivities were also produced by helium bombardment of other Group III-V compounds; namely, GaP, GaSb, GaAs, and InGaAs.

The following examples describe the experiments we performed to demonstrate these results. The materials, dimensions, operating conditions and other parameters are illustrative only and, unless otherwise stated, are not intended to limit the scope of the invention.

EXAMPLE I

This example describes the helium bombardment of p-type and n-type samples of InP. The p-type InP materials were grown by liquid encapsulated Czochralski (LEC) and were Zn-doped with about $9\times10^{17}$ and $6\times10^{18}$ $cm^{-3}$ initial hole concentrations. The n-type material was grown by LEC techniques and had a carrier concentration of $1\times10^{18}$ $cm^{-3}$. All wafers were polished with a brominemethanol solution to a final thickness of 250 $\mu$m.

The p-type samples were prepared by evaporating a 2000 Angstrom thick layer 20 of Au and Zn ($\approx$12% Zn) on one surface and alloying at 430° C. for 20 seconds. This step was followed by the evaporation of Au and Zn on the opposite surface through a shadow mask resulting in 500 $\mu$m dots (masks 14) and a subsequent alloying at 430° C. for 20 seconds.

The n-type samples were metallized by vapor deposition on both sides with a 2000 Angstrom layer of pure Au; i.e., first, layer 20 was formed on the full area of the back surface and then masks 14 were formed by a deposition on the opposite surface through a shadow mask, resulting in dots of either 125 or 500 $\mu$m diameter. Since this procedure resulted in low resistance contacts without an alloying step, no heat treatment was subsequently performed.

All ion irradiations of the samples were performed at room temperature at a fixed energy through the metal masks 14 at fluences form about $1\times10^{11}$ to $1\times10^{16}$ ions/$cm^2$ and a beam current of less than about 20 $\mu$A to reduce thermal effects. Other beam currents are useful. All bombardments of p-type InP were made at 200 keV. Helium-3 was used to bombard samples having either $9\times10^{17}$ or $6\times10^{18}$ $cm^{-3}$ hole concentrations, and helium-4 was used to bombard only the $6\times10^{18}$ $cm^{-3}$ material. The bombardments of n-type InP were made at energies of 270 keV with helium-3 and at 250 keV with helium-4.

Figure 2:
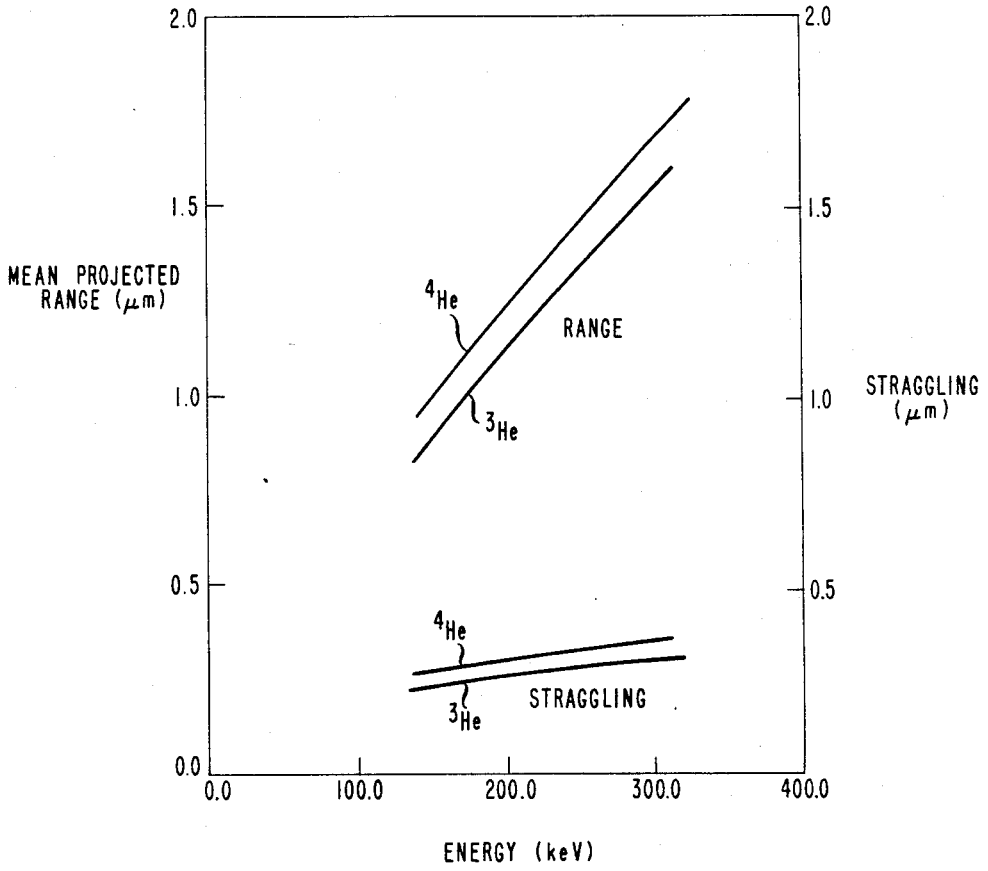
FIG. 2 is a plot of a Monte Carlo simulation of helium bombardment into InP showing the mean projected range ($R_p$) and the straggling ($\Delta R_p$)

Helium-3 and helium-4 bombardments were simulated via Monte Carlo simulations. Results for the mean projected range ($\overline{R}_p$) and straggling ($\Delta\overline{R}_p$) versus bombardment energy are shown in FIG. 2. although helium-4 has slightly greater mass than helium-3, it can be seen that both $\overline{R}_p$ and $\Delta\overline{R}_p$ are greater for helium-4 than for helium-3 at all energies simulated.

Resistance measurements were made between the top surface dot contacts (metal masks 14) and the back surface full area contacts (layer 20) around zero bias. The ohmic behavior of both n-type and p-type samples were checked prior to irradiation and were found to be linear and symmetrical in both directions.

After irradiation, ohmic behavior was observed, for all samples, in both directions to $\pm0.1$ volt or greater and at slightly higher voltages the I-V characteristics exhibited curvature. However, at no time was type conversion detected. For the n-type samples, measurements were made for both the 125 and 500 $\mu$m dots and the resistance was found to scale with the area.

When the applied voltage was increased beyond the nonlinear region, a typical I-V characteristic showed that the forward and reverse bias currents became asymmetrical, but linear with a slope of two on a log-log plot. This slope is indicative of a space charge limited regime.

Using the linear regions, with a slope of one, of the I-V characteristic and the range values derived by the Monte Carlo simulation, the resultant resistivities were calculated. Since the resistance due to the bulk material and the ohmic contacts was small enough to be neglected, the average resistivity of the bombarded layer is:

$$\bar{\rho}_b = R_T A/W \quad (1)$$

where $R_T$ is the total measured resistance of the bombarded sample between a dot contact and the full surface contact, A is the area of the dot contact, and W is the width of the compensated region. The width of the compensated region was taken from the Monte Carlo simulation to be the mean projected range $\overline{R}_p$). Deep level studies of deuteron ions irradiated into InP indicate that the high damaged region likely extends from the surface to the end of the range. This procedure is a more conservative way to estimate the effective resistivity than to apply the often-used standard deviation; i.e., the straggling. Therefore, Eq. (1) becomes:

$$\bar{\rho}_b = R_T A/\overline{R}_p . \quad (2)$$

Figure 3:
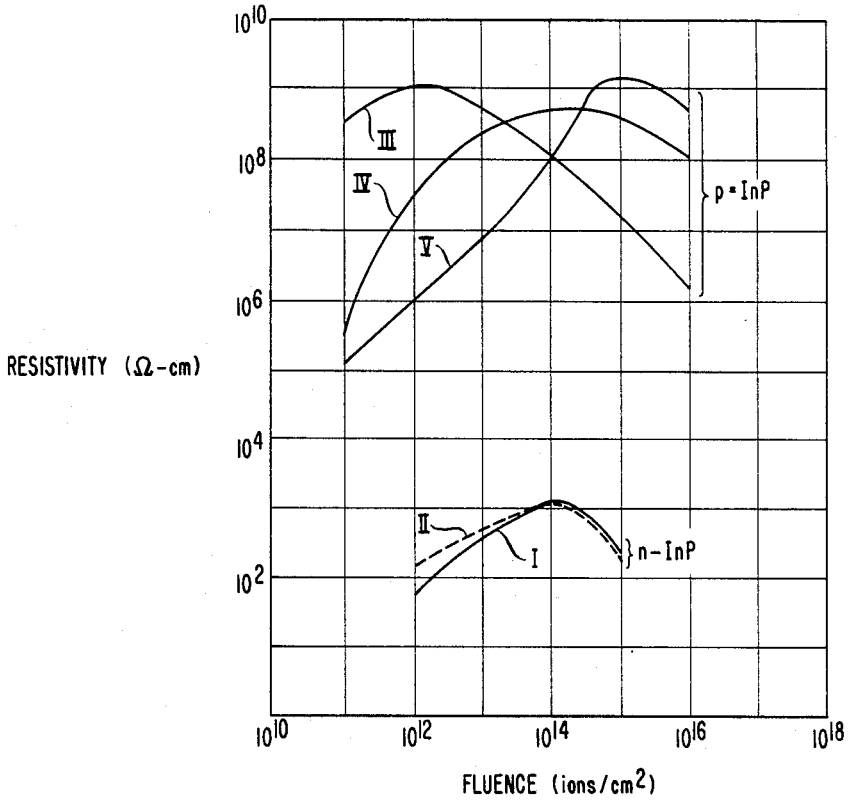
FIG. 3 is a graph of average resistivity (ohm-cm) of the bombarded region as a function of ion dose. Resistance measurements were made on p-type InP (curves III, IV and V) and on n-type InP (curves I and II) which were bombarded at a constant, single-energy of 200, 250 or 270 KeV wtih helium-3 or helium-4 over a dose range of $1\times10^{11}$ to $1\times10^{16}$ ions/cm$^2$. The carrier concentrations and bombardment species varied with the samples.

FIG. 3 shows the measured average resistivity versus the bombardment dose for both helium-3 and helium-4 bombardment into n-type InP (curves I and II) and p-type InP (curves II, III and IV). Bombardments of helium-3 and helium-3 into n-type InP were similar in that both produced average peak resistivities of about $10^3$ ohm-cm at a bombardment dose of $10^{14}$ ions/$cm^2$. The bombardments of helium-3 and helium-4 into p-type InP, however, resulted in average resistivity peaks in the $10^8$–$10^9$ ohm-cm region, and the two ion species produced a slight difference in average resistivity when bombarded into the same p-type material ($6\times10^{15}$ $cm^{-3}$). The helium-3 bombardment produced a layer with a broader peak over a fluence range of $10^{13}$–$10^{16}$ ions/$cm^2$, whereas the average resistivity due to the helium-4 implant peaked more sharply at a fluence of $10^{15}$ ions/$cm^2$. It is also noted that helium-3 bombardments into lower doped material produced a corresponding shift of peak resistivity toward lower fluence. All of the curves of FIG. 3 exhibit a decrease in resistivity at fluences above that corresponding to the peak resistivity. This phenomenon is generally attributed to the onset of a hopping conduction due to a high density of deep states.

EXAMPLE II

Simpler experiments were performed on separate samples of GaP, GaSb, and GaAs, each of which was doped p-type (mid-$10^{17}$/$cm^3$ to low $10^{18}$/$cm^3$) and was bombarded with helium-3 ions at an energy of 75 keV and a dose of $1\times10^{14}$/$cm^2$. Similarly, an n-type ($3\times10^{17}$/$cm^3$) sample of n-InGaAs was bombarded with helium-4 ions at an energy of 75 keV and a dose of $1\times10^{14}$/cm. A two-point probe technique was used to measure conductivity changes between two points of the sample surface before and after bombardment. Using this technique, we measured I-V characteristics which clearly showed a significant decrease in slope (increase in resistivity) after bombardment.

It is to be understood that the above-described arrangements are merely illustrative of the many possible specific embodiments which can be devised to represent application of the principles of the invention. Numerous and varied other arrangements can be divised in accordance with these principles by those skilled in the art without departing from the spirit and scope of the invention. In particular, results of the Monte Carlo simulation of InP clearly show that implant depths suitable for device fabrication are readily attainable in commercially available ion-implantation equipment. Several devices are shown in FIG. 4 (a heterostructure laser), and in FIG. 5 (a planar photodiode or LED).

Device Structures

The laser of FIG. 4 is a schematic of a basic double heterostructure which includes opposite conductivity type, wide bandgap, cladding layers (e.g., an n-InP layer 30 and p-InP layer 32) and a thin, narrower bandgap active layer (e.g., an InGaAsP layer 34) between layers 30 and 32 and essentially lattice-matched thereto. These layers are epitaxially grown on a substrate 36 (e.g., n-InP) by techniques well-known in the art (e.g., LPE, MBE, MO-CVD). A typical contact-facilitating layer 38 is formed on top of layer 32. In accordance with one embodiment of our invention, the laser includes laterally separate, high resistivity, helium-bombarded zones 40 which extend from the top surface of layer 38 and into cladding layer 32, preferably to a depth short of the active layer 34. As is typical in strip geometry lasers of this type, zones 40 form therebetween a narrow, low resistivity channel 42 through which pumping current flows from source 44. When this current exceeds the lasing threshold, stimulated radiation is emitted from the portion of the active layer under channel 42. This radiation emanates typically from parallel cleaved facets (parallel to the plane of the paper) which form an optical resonator. Below threshold, however, the same device emits spontaneous radiation and hence functions as an edge-emitting LED.

In a laser or edge-emiting LED the channel 42 is an elongated parallelepiped which extends perpendicular to the plane of the paper, and the separate zones 40 bound the sides of the channel. On the other hand, in a surface emitting LED the channel would be essentially cylindrical, and the zones 40 would be part of a single, annular, high resistivity zone surrounding the cylindrical channel.

Alternatively, our helium bombardment technique may be used to passivate a p-n junction device as shown in FIG. 5. Here, a p-n junction 50 is formed between n-type layer 52 and p-type layer 54. Laterally separate helium-bombarded zones 56 penetrate through the junction 50 and form therebetween device regions 58 which may function, for example, either as surface emitting LEDs or as photodiodes. The structure may serve as an array of devices or may be diced into individual chips (e.g., by cleaving or cutting along planes 60).

Finally, our invention may also be practiced by helium bombardment of a surface (e.g., a substrate surface) and epitaxial growth of a device structure on the bombarded surface, provided that at the growth temperature the helium damage is not annealed out.

Moreover, with a suitably modified ion-implantation apparatus, it may be possible to utilize a mixture of helium-3 and helium-4.

What is claimed is:

1. A method of manufacturing a semiconductor device, which includes a process of creating at least one high resistivity semiconductor zone in Group III-V semiconductor body, is CHARACTERIZED IN THAT said process comprises the step of irradiating said zone with helium ions.

2. The method of claim 1 wherein said zone is irradiated with $^4$He ions.

3. The method of claim 1 wherein said zone is irradiated with $^3$He ions.

4. The method of claims 1, 2 or 3 wherein said body includes indium and phosphorus.

5. The method of claim 4 wherein said zone is irradiated with ions haing a fluence of approximately $10^{11}$–$10^{16}$ ions/cm$^2$ and an energy of approximately 150–270 keV.

6. A method of manufacturing a semiconductor device comprising the steps of:

providing a single crystal Group III-V compound semiconductor body, forming a patterned mask on one surface of said body, and irradiating said patterned surface with helium ions so as to create high resistivity zones under the unmasked portions of said surface.

7. The method of claim 6 wherein said zone is irradiated with $^4$He ions.

8. The method of claim 6 wherein said zone is irradiated with $^3$He ions.

9. The method of claims 6, 7 or 8 wherein said body includes indium and phosphorus.

10. The method of claim 8 wherein said zone is irradiated with ions having a fluence of approximately $10^{11}$–$10^{16}$ ions/cm$^2$ and an energy of approximately 150–270 keV.

11. A semiconductor light emitting device comprising:

a Group III-V compound semiconductor body containing indium adn phosphours and including an active layer, means for constraining pumping current to flow in a relatively narrow channel across said active layer, and electrode means for applying said pumping current to said body CHARACTERIZED IN THAT said constraining means comprises helium-ion bombarded regions which bound the sides of said channel.

12. The device of claim 11 wherein said regions are $^4$He bombarded regions.

13. The devive of claim 11 wherein said regions are $^3$He bombarded regions.

14. The device of claim 11 wherein said channel is essentially an elongated, parallelepiped, and said regions comprise elongated laterally separate zones which bound said channel.

15. The device of claim 11 wherein said channel is essentially cylindrical and said regions comprise an annular zone surrounding said channel.

16. A semiconductor device comprising a Group III-V compound body containing indium and phosphorus, a planar p-n junction in said body, and a high resistivity, helium-ion bombarded region which extends through said junction.

17. The device of claim 16 wherein said region comprises a plurality of laterally separate, high resistivity zones which extend from a surface of said body through said junction so as to form between each pair of said plurality a p-n junction device.

18. The device of claim 16 wherein said region comprises a $^4$He bombarded region.

19. The device of claim 16 wherein said region comprises a $^3$He bombarded region.

* * * * *